(12) United States Patent
Gu et al.

(10) Patent No.: US 10,108,089 B2
(45) Date of Patent: Oct. 23, 2018

(54) PHOTOSENSITIVE RESIN COMPOSITION AND METHOD FOR FORMING QUANTUM DOT PATTERN USING THE SAME

(71) Applicant: BOE TECHNOLOGY GROUP CO., LTD., Beijing (CN)

(72) Inventors: Jingxia Gu, Beijing (CN); Shi Shu, Beijing (CN); Feng Zhang, Beijing (CN); Guanbao Hui, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 5 days.

(21) Appl. No.: 14/437,047

(22) PCT Filed: Jun. 23, 2014

(86) PCT No.: PCT/CN2014/080493
§ 371 (c)(1),
(2) Date: Apr. 20, 2015

(87) PCT Pub. No.: WO2015/100968
PCT Pub. Date: Jul. 9, 2015

(65) Prior Publication Data
US 2016/0011506 A1   Jan. 14, 2016

(30) Foreign Application Priority Data
Dec. 30, 2013 (CN) .......................... 2013 1 0744287

(51) Int. Cl.
*G03F 7/031* (2006.01)
*G03F 7/029* (2006.01)
(Continued)

(52) U.S. Cl.
CPC ............ *G03F 7/031* (2013.01); *G03F 7/0048* (2013.01); *G03F 7/027* (2013.01); *G03F 7/028* (2013.01);
(Continued)

(58) Field of Classification Search
None
See application file for complete search history.

(56) References Cited

U.S. PATENT DOCUMENTS

2002/0110740 A1* 8/2002 Otaki ...................... G03F 7/001
430/1
2004/0067431 A1* 4/2004 Arney ..................... B82Y 10/00
430/138
(Continued)

FOREIGN PATENT DOCUMENTS

CN    1688938 A    10/2005
CN    101512754 B    12/2011
(Continued)

OTHER PUBLICATIONS

Wang et al ("Facile encapsulation of SiO2 on ZnO quantum dots and its application in waterborne UV-shielding polymer coatings", Journal of Materials Chemistry C (2013), vol. 1 (issue 45), p. 7547-7553).*

(Continued)

*Primary Examiner* — Sin J Lee
(74) *Attorney, Agent, or Firm* — Brooks Kushman P.C.

(57) ABSTRACT

The present disclosure provides a photosensitive resin composition and a method for forming a quantum dot pattern using the same. The photosensitive resin composition includes quantum dots which are dispersed in the photosensitive resin composition and each has a modification layer. The method for forming a quantum dot pattern includes coating, exposing and developing a photoresist to obtain the quantum dot pattern, wherein the photoresist is the above-mentioned photosensitive resin composition.

19 Claims, 2 Drawing Sheets

(51) Int. Cl.
*G03F 7/028* (2006.01)
*G03F 7/027* (2006.01)
*G03F 7/032* (2006.01)
*G03F 7/004* (2006.01)
*G03F 7/30* (2006.01)
*G03F 7/20* (2006.01)

(52) U.S. Cl.
CPC .............. *G03F 7/029* (2013.01); *G03F 7/032* (2013.01); *G03F 7/20* (2013.01); *G03F 7/30* (2013.01)

(56) References Cited

U.S. PATENT DOCUMENTS

| | | | | |
|---|---|---|---|---|
| 2004/0094752 | A1* | 5/2004 | Ito | G03F 7/0047 252/578 |
| 2004/0192804 | A1* | 9/2004 | Kura | C07D 295/112 522/65 |
| 2004/0266901 | A1* | 12/2004 | Shibuya | C07C 247/18 522/1 |
| 2007/0231733 | A1* | 10/2007 | Takada | G03G 5/14708 430/123.41 |
| 2009/0128767 | A1* | 5/2009 | Suezaki | C08F 220/28 349/155 |
| 2010/0209845 | A1* | 8/2010 | Kubota | C09B 67/009 430/270.1 |
| 2011/0221431 | A1* | 9/2011 | Kwon | B05D 3/207 324/246 |
| 2012/0082728 | A1* | 4/2012 | Schneider | A61K 47/48176 424/491 |
| 2012/0135235 | A1 | 5/2012 | Bong et al. | |
| 2012/0207939 | A1* | 8/2012 | Shukla | C08F 2/50 427/487 |
| 2013/0105440 | A1* | 5/2013 | Lu | G03F 7/0047 216/41 |
| 2014/0158982 | A1* | 6/2014 | Park | G02B 6/005 257/13 |
| 2015/0083970 | A1* | 3/2015 | Koh | C09K 11/02 252/301.35 |

FOREIGN PATENT DOCUMENTS

| | | | |
|---|---|---|---|
| CN | 102559191 A | * | 7/2012 |
| CN | 103728837 A | | 4/2014 |

OTHER PUBLICATIONS

Lu et al ("Fabrication and Characterization of Stable Ultrathin Film Micropatterns Containing CdS Nanoparticles", Advanced Functional Materials (2003), vol. 13 (No. 7), p. 548-552).*
Lu et al ("A Facile Route to ZnS-Polymer Nanocomposite Optical Materials with High Nanophase Content via __—Ray Irradiation Initiated Bulk Polymerization", Advanced Materials, vol. 18 (2006), p. 1188-1192).*
Archana et al ("Effect of Multiple Organic Ligands on Size Uniformity and Optical Properties of ZnSe Quantum Dots", Materials Research Bulletin, vol. 47 (2012), p. 1892-1897).*
Li et al ("Enhanced Photorefractive Performance in CdSe Quantum-Dot-dispersed Poly(styrene-co-acrylonitrile) Polymers", Applied Physics Letters, vol. 96 (2010), p. 253302-1-253302-3).*
Machine-assisted English translation of CN 102559191 A (2012).*
Derwent English abstract for CN 102559191 A (2012).*
Office Action in Chinese Patent Application No. 201310744287.4, dated Mar. 8, 2016.
International Search Report and Written Opinion in PCT International Application No. PCT/CN2014/080493, dated Oct. 9, 2014.

* cited by examiner

PHOTOSENSITIVE RESIN COMPOSITION AND METHOD FOR FORMING QUANTUM DOT PATTERN USING THE SAME

CROSS-REFERENCE TO RELATED APPLICATIONS

The present application is the U.S. National Phase of International Patent Application No. PCT/CN2014/080493, filed on Jun. 23, 2014 which claims a priority to Chinese patent application No. 201310744287.4 filed on Dec. 30, 2013, the disclosure of which is incorporated in its entirety by reference herein.

TECHNICAL FIELD

The present disclosure relates to a photosensitive resin composition and a method for forming a quantum dot pattern using the same.

BACKGROUND

A quantum dot, also known as semiconductor nanocrystal, is a novel kind of a semiconductor nanomaterial having a size of 1 nm to 10 nm. The quantum size effect and the dielectric confinement effect enable the quantum dot to have unique photoluminescence (PL) and electroluminescence (EL) property. As compared with traditional organic fluorescent dyes, the quantum dot has excellent optical properties, such as high quantum yield, high photochemical stability (i.e., being difficult to be photo-degraded), wide excitation spectrum, narrow emission spectrum, high color purity, light in different colors adjusted by controlling the quantum dot size. As a result, applications of the quantum dot in display, lighting, solar cell, biological markers and other fields have become research hotspots worldwide.

In the field of display technology, the quantum dot has advantages of wide color gamut, high brightness and low energy consumption (or high quantum efficiency). However, a method for forming a quantum dot pattern is one of difficulties which need to be solved urgently at present. Current methods for forming a film with quantum dots arranged in an array manner mainly include printing method such as transfer printing and micro-contact printing. However, the printing method for forming the film with quantum dots has disadvantages of: exutive quantum dots, inaccuracy of transferring a template pattern to a substrate, low resolution (at a level of 100 microns), pattern changes caused by ink diffusion, and difficulties in achieving large-scale production, etc.

SUMMARY

An object of the present disclosure is to provide a photosensitive resin composition and a method for forming a quantum dot pattern using the photosensitive resin composition.

In one aspect, the present disclosure provides in embodiments a photosensitive resin composition, including quantum dots which are dispersed in the photosensitive resin composition and each has a modification layer.

Alternatively, the modification layer is an organic ligand layer, an inorganic compound layer or a polymer layer.

Alternatively, the organic ligand is amines, carboxylic acids or phosphines containing a $C_8$-$C_{18}$ hydrocarbon chain; dithiocarbamate or small-molecular sulfhydryl compounds with multi-functional groups.

Alternatively, the inorganic compound is silicon dioxide or sodium citrate.

Alternatively, the polymer is polystyrene, polyacrylic acid or polyethylene glycol.

Alternatively, the photosensitive resin composition includes:
- 5 wt % to 45 wt % of alkali soluble resin,
- 0.5 wt % to 18 wt % a photosensitive resin or monomer containing vinyl unsaturated double-bond,
- 3 wt % to 15 wt % of the quantum dot having the modification layer,
- 0.1 wt % to 3 wt % of a photoinitiator,
- 40 wt % of 85 wt % of a solvent,
- 0.1 wt % to 7 wt % of a silane coupling agent, and
- 0.1 wt % to 1 wt % of an additive.

Alternatively, the photosensitive resin or monomer containing vinyl unsaturated double-bond is at least two selected from the group consisting of 1,6-hexanediol diacrylate, tripropanediol diacrylate, tetrapropanediol diacrylate, trimethylolpropane triacrylate, trimethylolpropane ethoxylate triacrylate, pentaerythritol tetraacrylate, tritrimethylolpropane tetraacrylate and dipentaerythritol pentaacrylate.

Alternatively, the alkali soluble resin is aromatic (meth) acrylic acid half ester or a copolymer of styrene-maleic anhydride.

Alternatively, the quantum dots are red quantum dots, yellow quantum dots, orange quantum dots, green quantum dots, blue quantum dots or a combination thereof.

Alternatively, the photoinitiator is at least one selected from the group consisting of: benzoyl, benzoyl methylether, benzoyl ethylether, benzoyl isopropyl ether, benzoyl butyl ether, (2,4,6-trimethylbenzoyl) diphenyl phosphine oxide, 2,2'-bis(2-dichlorophenyl)-4,4',5,5'-tetraphenyl-1,2'-biimidazole, 2-ethyl anthraquinone, dibenzoyl, camphorquinone, methyl benzoylformate, 4-hydroxyphenyl dimethylsulfonium p-toluenesulfonate, triphenylsulfonium hexafluoroantimonate, dipenyliodonium hexafluoroantimonate, benzoyl toluenesulfonate, 2-hydroxy-2-methyl-1-phenylpropyl-1-ketone, diethoxy acetophenol, 2-methyl-2-morpholino-1-(4-methyl thiophenyl), 2-hydroxy-2-methyl-1-[4-(methylethylene)phenyl]propyl-1-ketone, 2,4-bis(trichloromethane)-6-(4-methoxyphenyl)-1,3,5-triazine, 2,4-bisi(trichloromethyl)-6-piperonyl-1,3,5-triazine, 2,4-bis(trichloromethane)-6-[2-(5-methylfuran)-vinyl]-1,3,5-triazine and 2-phenyl benzyl-2-dimethylamine-1-(4-morpholine benzyl phenyl)butanone.

Alternatively, the solvent is at least one selected from the group consisting of: formic acid, acetic acid, chloroform, acetone, butanone, fatty alcohol and ethylene glycol monomethyl ether, ethylene glycol monoethyl ether, ethylene glycol monopropyl ether, ethylene glycol monobutyl ether, diethylene glycol diethyl ether acetic acetate, methyl ethyl ketone, methyl isobutyl ketone, monomethyl ether glycol ester, gamma-butyrolactone, methylacetic-3-ethyl ether, butyl carbitol, butyl carbitol acetate, propanediol monomethyl ether, propanediol monomethyl ether acetate, cyclohexane, xylene and isopropyl alcohol.

Alternatively, the additive is a dispersant or a flatting agent.

In another aspect, the present disclosure provides in embodiments a method for forming a quantum dot pattern, including coating, exposing and developing a photoresist to obtain the quantum dot pattern, wherein the photoresist is the photosensitive resin composition above-mentioned.

According to embodiments of the present disclosure, the method for forming a quantum dot pattern includes coating, exposing and developing the photoresist to obtain the quantum dot pattern, in which the photoresist is the above-mentioned photosensitive resin composition. The method has advantages of a simple manufacturing process a fine pattern, a stable bonding between the quantum dot pattern and the substrate which are difficult to be separated, and high resolution. Moreover, the method may achieve a mass production based on existing devices, which greatly improve application prospect of the quantum dots.

DETAILED DESCRIPTION

Figure 1:
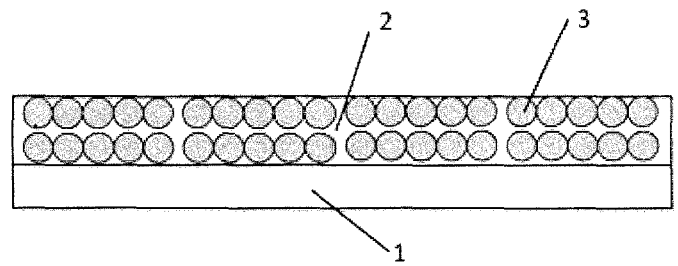
FIG. 1 is schematic view showing a glass substrate coated with a photosensitive resin composition according to an embodiment of the present disclosure.

According to embodiments of the present disclosure, the photosensitive resin composition includes quantum dots which are dispersed in the photosensitive resin composition and each has a modification layer.

The "quantum dots", referring to a nanoscale assembly of atoms and molecules, may consist of one type semiconductor material, such as the semiconductor material from Group II-VI (e.g., A(II)B(VI)) and the semiconductor material from Group III-V (e.g., C(III)D(V)); or may consist of at least two types of semiconductor materials. The semiconductor material A(II)B(VI) includes compounds formed with elements in Group II (Zn, Cd, Hg) and elements in Group VI (S, Se and Te), such as ZnS, ZnSe, ZnTe, CdS, CdSe, CdTe, HgS, HgSe or HgTe. The semiconductor material C(III)D(V) includes compounds formed with elements in Group III (B, Al, Ga and In) and elements in Group V (N, P, As and Sb), such as BN, BP, Bas, BSb, AlN, AlP, AlAs, AlSb, GaN, GaP, GaAs, GaSb, InAs, InN, InP or InSb.

According to an example of the present disclosure, the modification layer is an organic ligand layer, an inorganic compound layer or a polymer layer. The modification layer is used to stabilize the quantum dots.

According to an example of the present disclosure, the organic ligand is amines, carboxylic acids or phosphines containing a $C_8$-$C_{18}$ hydrocarbon chain, such as oleyl amine, oleic acid, trioctylphousphine oxide (TOPO), trioctylphosphine (TOP), dodecylamine (DDA), octadecene (ODE) or hexadecylamine (HAD); dithiocarbamate (DTC), such as sodium dithiocarbamate proline (ProDTC); small-molecular sulfhydryl compounds with multi-functional groups, such as mercaptoethanol, thioglycolic acid, cysteamine, glutathione, cysteine, L-cysteine salt or 3-mercapto-1,2-propanediol.

According to an example of the present disclosure, the inorganic compound is silicon or sodium citrate.

According to an example of the present disclosure, the polymer is polystyrene, polyacrylic acid or polyethylene glycol.

The quantum dots having a modification layer can be available commercially, and the quantum dots each having a modification layer may be the following purchased quantum dots.

Quantum dots CdSe/ZnS each having a surface ligand of TOPO (trioctylphousphine oxide) and HAD (1-hexadecylamine), purchased from WUHAN JIYUAN QUANTUM DOTS CO., LTD., wherein the blue quantum dots are Q1515, Q1545; the green quantum dots are Q1565, Q1585; and the red quantum dots are Q1605, Q1625.

Quantum dots CdSe/ZnS each having a surface ligand of oleyl amine, purchased from Ocean Nanotech, wherein the blue quantum dots are QSP-460-05, the green quantum dots are QSP-580-05, and the red quantum dots are QSP-620-05.

Quantum dots CdSe/ZnS having a surface ligand of carboxyl (—COOH), purchased from WUHAN JIYUAN QUANTUM DOTS CO., LTD., wherein the blue-green quantum dots are Q2525 and Q2565, and the red quantum dots are Q2625.

According to an embodiment of the present disclosure, the photosensitive resin composition includes:

5 wt % to 45 wt % of alkali soluble resin,
0.5 wt % to 18 wt % of the photosensitive resin or monomer containing vinyl unsaturated double-bond,
3 wt % to 15 wt % of the quantum dot having the modification layer,
0.1 wt % to 3 wt % of a photoinitiator,
40 wt % of 85 wt % of a solvent,
0.1 wt % of 7 wt % of a silane coupling agent, and
0.1 wt % of 1 wt % of an additive.

According to an example of the present disclosure, the photosensitive resin or monomer containing vinyl unsaturated double-bond is at least two selected from the group consisting of 1,6-hexanediol diacrylate, tripropanediol diacrylate, tetrapropanediol diacrylate, trimethylolpropane triacrylate, trimethylolpropane ethoxylate triacrylate, pentaerythritol tetraacrylate, tritrimethylolpropane tetraacrylate and dipentaerythritol pentaacrylate.

According to an example of the present disclosure, the alkali soluble resin is aromatic (meth) acrylic acid half ester or a copolymer of styrene-maleic anhydride.

According to an example of the present disclosure, the quantum dots are red quantum dots, yellow quantum dots, orange quantum dots, green quantum dots, blue quantum dots or a combination thereof.

According to an example of the present disclosure, the photoinitiator is selected from the group consisting of: benzoyl, benzoyl methylether, benzoyl ethylether, benzoyl isopropyl ether, benzoyl butyl ether, (2,4,6-trimethylbenzoyl) diphenyl phosphine oxide, 2,2'-bis(2-dichlorophenyl)-4,4',5,5'-tetraphenyl-1,2'-biimidazole, 2-ethyl anthraquinone, dibenzoyl, camphorquinone, methyl benzoylformate, 4-hydroxyphenyl dimethylsulfonium p-toluenesulfonate, triphenylsulfonium hexafluoroantimonate, dipenyliodonium diphenyl hexafluoroantimonate, benzoyl toluenesulfonate, 2-hydroxy-2-methyl-1-phenylpropyl-1-ketone, diethoxy acetophenol, 2-methyl-2-morpholino-1-(4-methyl thiophenyl), 2-hydroxy-2-methyl-1-[4-(methylethylene)phenyl] propyl-1-ketone, 2,4-bis(trichloromethane)-6-(4-methoxyphenyl)-1,3,5-triazine, 2,4-bis(trichloromethyl)-6-piperonyl-1,3,5-triazine, 2,4-bis(trichloromethane)-6-[2-(5-methylfuran)-vinyl]-1,3,5-triazine and 2-phenyl benzyl-2-dimethylamine-1-(4-morpholine benzyl phenyl)butanone.

According to an example of the present disclosure, the solvent is at least one selected from the group consisting of: formic acid, acetic acid, chloroform, acetone, butanone, fatty alcohol and ethylene glycol monomethyl ether, ethylene glycol monoethyl ether, ethylene glycol monopropyl ether, ethylene glycol monobutyl ether, diethylene glycol diethyl ether acetic acetate, methyl ethyl ketone, methyl isobutyl ketone, monomethyl ether glycol ester, gamma-butyrolactone, methylacetic-3-ethyl ether, butyl carbitol, butyl carbitol acetate, propylene glycol monomethyl ether, propylene glycol monomethyl ether acetate, cyclohexane, xylene and isopropyl alcohol.

According to an example of the present disclosure, the additive is a dispersant or a flatting agent.

According to an embodiment of the present disclosure, a method for forming a quantum dot pattern is provided. The method includes coating, exposing and developing a photoresist to obtain the quantum dot pattern, wherein the photoresist is the above-mentioned photosensitive resin composition.

EXAMPLES

Example 1

The photosensitive resin composition was obtained by evenly mixing 20 wt % of the alkali soluble resin SB400 (purchased from Sarbox Resins Methacrylates Company), 10 wt % of the photosensitive resin containing vinyl unsaturated double-bond SR494 (Sartomer Company), 15 wt % of the blue quantum dots, 2 wt % of the photoinitiator CIBA369 (CIBI Chemical Company), 0.1 wt % of the silane coupling agent KH550, 0.1 wt % of the dispersant Disper-BYK 160 (BYKAdditives & Instruments) being as the additive and 52.8 wt % of propanediol monomethyl ether acetate being as the solvent.

Example 2

The photosensitive resin composition was obtained by evenly mixing 45 wt % of the alkali soluble resin SB400 (purchased from Sarbox ResinsMethacrylates Company), 0.5 wt % of the photosensitive resin containing vinyl unsaturated double-bond SR494 (Sartomer Company), 4 wt % of the blue quantum dots, 0.1 wt % of the photoinitiator CIBA369 (CIBI Chemical Company), 7 wt % of the silane coupling agent KH560, 1 wt % of the dispersant DisperBYK 2000 (BYK Additives & Instruments) being as the additive and 42.4 wt % of propanediol monomethyl ether acetate being as the solvent.

Example 3

The photosensitive resin composition was obtained by evenly mixing 5 wt % of the alkali soluble resin SB401 (purchased from Sarbox ResinsMethacrylates Company), 18 wt % of the photosensitive resin SR295 containing vinyl unsaturated double-bond (Sartomer Company), 3 wt % of the blue quantum dots, 3 wt % of the photoinitiator CIBA369 (CIBI Chemical Company), 6 wt % of the silane coupling agent KH570, 0.6 wt % of the flatting agent EB350 and 64.4 wt % of propanediol monomethyl ether acetate being as the solvent.

Performance Tests

Figure 2:
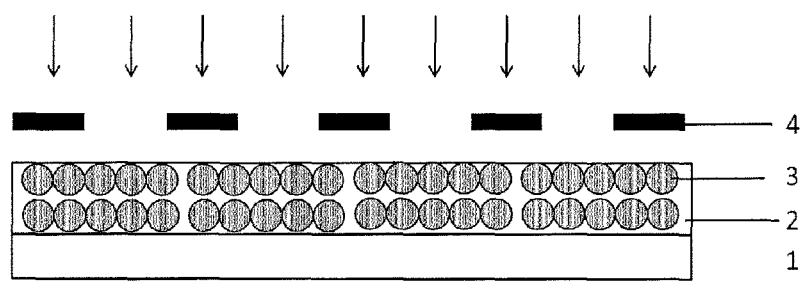
FIG. 2 is a schematic view showing the glass substrate coated with the photosensitive resin composition in FIG. 1 when being exposed.
Figure 3:
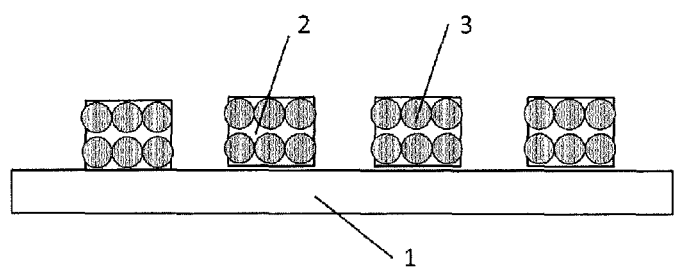
FIG. 3 is a schematic view showing a quantum dot pattern obtained by developing exposed glass substrate in FIG. 2 and removing unexposed part.
Figure 4:
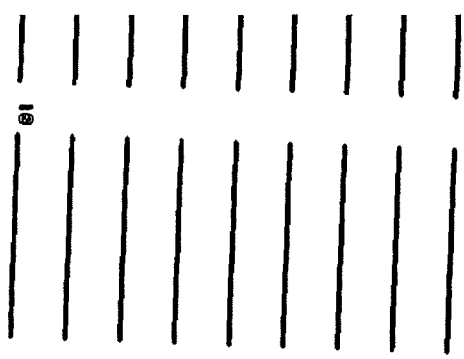
FIG. 4 is a schematic view showing the quantum dot pattern formed with the photosensitive resin composition in Example 1 as a photoresist.

The photosensitive resin compositions obtained in Examples 1 to 3 were taken as a photoresist for obtaining the quantum dot patterns, respectively. Firstly, as shown in FIG. 1, the photosensitive resin composition was coated on a surface of the glass substrate 1. Secondly, as shown in FIG. 2, the glass substrate 1 after being coated with the photosensitive resin composition is exposed through a mask plate having a certain pattern. Finally, as shown in FIG. 3, the quantum dot pattern was formed by developing the exposed glass substrate 1 and removing unexposed part of the photosensitive resin composition. The quantum dot pattern, which was formed by taking the photosensitive resin composition obtained in any one of Examples 1 to 3 as the photoresist, is of a fine pattern. FIG. 4 is a photograph showing the quantum dot pattern, which is formed by taking the photosensitive resin composition obtained in Example 1 as the photoresist, with a line width of 10 μm (as shown in FIG. 4). The bonding stability between the glass substrate and the photosensitive resin composition obtained in any one of Examples 1 to 3 is measured through Cross-Cut Test.

The Cross-Cut Test was performed in accordance with a test standard of ASTM D3359-08, i.e., a film coated on a substrate is cross-cut into a plurality of uniform squares having a certain dimension by BYK-Gardner, and adhesion strength therebetween is evaluated by assessing integrity of the film within a square, representing by "grade", wherein ASTM grade 5 represents that the squares is of an incision with smooth edges without any exfoliation.

Figure 5:
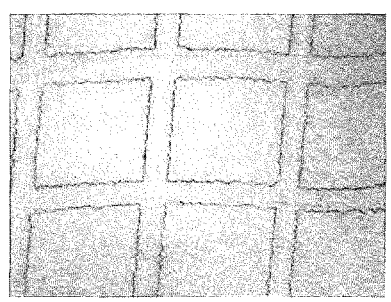
FIG. 5 is a photograph showing a Cross-Cut Test result of the photosensitive resin composition in Example 1.

The adhesion strength between the glass substrate and the quantum dot pattern formed with the photosensitive resin composition according to any one of Examples 1 to 3 is of ASTM grade 5. FIG. 5 is the photograph showing the Cross-Cut Test result of the photosensitive resin composition in Example 1, wherein each square has an area of 1 mm×1 mm.

The Cross-Cut Test result shows that the bonding between the substrate and the quantum dot pattern formed with the photosensitive resin composition according to any one of Examples 1 to 3 firmly is stable, which are difficult to be separated.

The quantum dot pattern formed with the photosensitive resin composition according to any one of Examples 1 to 3 also has excellent chemical resistances, which remains intact after being soaked in N-methyl pyrrolidone (NMP), isopropyl alcohol (IPA), tetramethyl ammonium hydroxide (TMAH) and acetone at 25° C. for 30 minutes.

The above descriptions show some preferred embodiments of the disclosure. It should be pointed out that, for one of ordinary skills in the art, various improvements and modifications may be made without departing from the principles of the disclosure, and these improvements and modifications should be construed as pertaining the protection scope of the disclosure.

What is claimed is:

1. A photosensitive resin composition, comprising quantum dots which are dispersed in the photosensitive resin composition and each has a modification layer, wherein the modification layer is an organic ligand layer, an inorganic compound layer or a polymer layer, the organic ligand is sodium dithiocarbamate proline, cysteamine, glutathione, cysteine or L-cysteine salt, the inorganic compound is sodium citrate, the polymer is polyacrylic acid or polyethylene glycol, and wherein the photosensitive resin composition comprises:
5 wt % to 45 wt % of alkali soluble resin, 0.5 wt % to 18 wt % of a photosensitive resin or monomer containing vinyl unsaturated double-bond, 3 wt % to 15 wt % of the quantum dots having the modification layer, 0.1 wt % to 3 wt % of a photoinitiator, 40 wt % to 85 wt % of a solvent, 0.1 wt % to 7 wt % of a silane coupling agent, and 0.1 wt % to 1 wt % of an additive.

2. The photosensitive resin composition according to claim 1, wherein the quantum dots consist of semiconductor material A(II)B(VI) from Group II-VI or semiconductor material C(III)D(V) from Group III-V, the semiconductor material A(II)B(VI) includes compounds formed with elements Zn, Cd, Hg in Group II and elements S, Se and Te in Group VI, the semiconductor material C(III)D(V) includes compounds formed with elements B, Al, Ga and In in Group III and elements N, P, As and Sb in Group V.

3. The photosensitive resin composition according to claim 1, wherein the quantum dots have a size of 1 nm to 10 nm and consist of semiconductor material A(II)B(VI) from Group II-VI or semiconductor material C(III)D(V) from Group III-V, the semiconductor material A(II)B(VI) includes compounds formed with elements Zn, Cd, Hg in Group II and elements S, Se and Te in Group VI, the semiconductor material C(III)D(V) includes compounds formed with elements B, Al, Ga and In in Group III and elements N, P, As and Sb in Group V.

4. The photosensitive resin composition according to claim 1, wherein the photosensitive resin or monomer containing vinyl unsaturated double-bond is at least two selected from the group consisting of 1,6-hexanediol diacrylate, tripropanediol diacrylate, tetrapropanediol diacrylate, trimethylolpropane triacrylate, trimethylolpropane ethoxylate triacrylate, pentaerythritol tetraacrylate, tritrimethylolpropane tetraacrylate and dipentaerythritol pentaacrylate.

5. The photosensitive resin composition according to claim 1, wherein the alkali soluble resin is aromatic (meth) acrylic acid half ester or a copolymer of styrene-maleic anhydride.

6. The photosensitive resin composition according to claim 1, wherein the photoinitiator is at least one selected from the group consisting of: benzoyl, benzoyl methylether, benzoyl ethylether, benzoyl isopropyl ether, benzoyl butyl ether, (2,4,6-trimethylbenzoyl)diphenyl phosphine oxide, 2,2'-bis(2-dichlorophenyl)-4,4',5,5'-tetraphenyl-1,2'-biimidazole, 2-ethyl anthraquinone, dibenzoyl, camphorquinone, methyl benzoylformate, 4-hydroxyphenyl dimethylsulfonium p-toluenesulfonate, triphenylsulfonium hexafluoroantimonate, dipenyliodonium hexafluoroantimonate, benzoyl toluenesulfonate, 2-hydroxy-2-methyl-1-phenylpropyl-1-ketone, diethoxy acetophenol, 2-methyl -2-morpholino-1-(4-methyl thiophenyl), 2-hydroxy-2-methyl-1-[4-(methylethylene)phenyl]propyl-1-ketone, 2,4-bis(trichloromethane)-6-(4-methoxyphenyl)-1,3,5-triazine, 2,4-bis(trichloromethyl)-6-piperonyl-1,3,5-triazine, 2,4-bis(trichloromethane)-6-[2-(5-methylfuran)-vinyl]-1,3,5-triazine and 2-phenyl benzyl-2-dimethylamine-1-(4-morpholine benzyl phenyl)butanone.

7. The photosensitive resin composition according to claim 1, wherein the solvent is at least one selected from the group consisting of: formic acid, acetic acid, chloroform, acetone, butanone, fatty alcohol and ethylene glycol monomethyl ether, ethylene glycol monoethyl ether, ethylene glycol monopropyl ether, ethylene glycol monobutyl ether, diethylene glycol diethyl ether acetic acetate, methyl ethyl ketone, methyl isobutyl ketone, monomethyl ether glycol ester, gamma-butyrolactone, methylacetic-3-ethyl ether, butyl carbitol, butyl carbitol acetate, propanediol monomethyl ether, propanediol monomethyl ether acetate, cyclohexane, xylene and isopropyl alcohol.

8. The photosensitive resin composition according to claim 1, wherein the additive is a dispersant or a flatting agent.

9. The photosensitive resin composition according to claim 1, wherein the quantum dots are red quantum dots, yellow quantum dots, orange quantum dots, green quantum dots, blue quantum dots or a combination thereof.

10. A method for forming a quantum dot pattern, comprising:
coating, exposing and developing a photoresist to obtain the quantum dot pattern, wherein the photoresist is the photosensitive resin composition according to claim 1.

11. A photosensitive resin composition, comprising quantum dots which are dispersed in the photosensitive resin composition and each has a modification layer, wherein the modification layer is an inorganic compound layer and the inorganic compound layer is sodium citrate, and the quantum dots have a size of 1 nm to 10 nm and consist of semiconductor material C(III)D(V) formed with elements B, Al, Ga and In in Group III and element N in Group V.

12. A method for forming a quantum dot pattern, comprising:
coating, exposing and developing a photoresist to obtain the quantum dot pattern, wherein the photoresist is the photosensitive resin composition according to claim 11.

13. A photosensitive resin composition, comprising quantum dots which are dispersed in the photosensitive resin composition and each has a modification layer, wherein the modification layer is an organic ligand layer, an inorganic compound layer or a polymer layer, the organic ligand is sodium dithiocarbamate proline, cysteamine, glutathione, cysteine, L-cysteine salt or 3-mercapto-1,2-propanediol, the quantum dots have a size of 1 nm to 10 nm and consist of semiconductor material A(II)B(VI) from Group II-VI or semiconductor material C(III)D(V) from Group III-V, the semiconductor material A(II)B(VI) includes compounds formed with elements Zn, Cd, Hg in Group II and elements S, Se and Te in Group VI, the semiconductor material C(III)D(V) includes compounds formed with elements B, Al, Ga and In in Group III and elements P, As and Sb in Group V;
wherein the photosensitive resin composition comprises: 5 wt % to 45 wt % of alkali soluble resin, 0.5 wt % to 18 wt % of a photosensitive resin or monomer containing vinyl unsaturated double-bond, 3 wt % to 15 wt % of the quantum dots having the modification layer, 0.1 wt % to 3 wt % of a photoinitiator, 40 wt % to 85 wt % of a solvent, 0.1 wt % to 7 wt % of a silane coupling agent, and 0.1 wt % to 1 wt % of an additive.

14. The photosensitive resin composition according to claim 13, wherein the photosensitive resin or monomer containing vinyl unsaturated double-bond is at least two selected from the group consisting of 1,6-hexanediol diacrylate, tripropanediol diacrylate, tetrapropanediol diacrylate, trimethylolpropane triacrylate, trimethylolpropane ethoxylate triacrylate, pentaerythritol tetraacrylate, tritrimethylolpropane tetraacrylate and dipentaerythritol pentaacrylate.

15. The photosensitive resin composition according to claim 13, wherein the alkali soluble resin is aromatic (meth) acrylic acid half ester or a copolymer of styrene-maleic anhydride.

16. The photosensitive resin composition according to claim 13, wherein the photoinitiator is at least one selected from the group consisting of: benzoyl, benzoyl methylether, benzoyl ethylether, benzoyl isopropyl ether, benzoyl butyl ether, (2,4,6-trimethylbenzoyl)diphenyl phosphine oxide, 2,2'-bis(2-dichlorophenyl)-4,4',5,5'-tetraphenyl-1,2'-biimidazole, 2-ethyl anthraquinone, dibenzoyl, camphorquinone, methyl benzoylformate, 4-hydroxyphenyl dimethylsulfonium p-toluenesulfonate, triphenylsulfonium hexafluoroantimonate, dipenyliodonium hexafluoroantimonate, benzoyl toluenesulfonate, 2-hydroxy-2-methyl-1-phenylpropyl-1-ketone, diethoxy acetophenol, 2-methyl-2-morpholino-1-(4- methyl thiophenyl), 2-hydroxy-2-methyl-1-[4-(methylethylene)phenyl]propyl-1-ketone, 2,4-bis(trichloromethane)-6-(4-methoxyphenyl)-1,3,5-triazine, 2,4-bis(trichloromethyl)-6-piperonyl-1,3,5-triazine, 2,4-bis(trichloromethane)-6-[2-(5-methylfuran)-vinyl]-1,3,5-triazine and 2-phenyl benzyl-2-dimethylamine-1-(4-morpholine benzyl phenyl)butanone.

17. The photosensitive resin composition according to claim 13, wherein the solvent is at least one selected from the group consisting of: formic acid, acetic acid, chloroform, acetone, butanone, fatty alcohol and ethylene glycol monomethyl ether, ethylene glycol monoethyl ether, ethylene glycol monopropyl ether, ethylene glycol monobutyl ether, diethylene glycol diethyl ether acetic acetate, methyl ethyl ketone, methyl isobutyl ketone, monomethyl ether glycol ester, gamma-butyrolactone, methylacetic-3-ethyl ether, butyl carbitol, butyl carbitol acetate, propanediol monomethyl ether, propanediol monomethyl ether acetate, cyclohexane, xylene and isopropyl alcohol.

18. The photosensitive resin composition according to claim 13, wherein the additive is a dispersant or a flatting agent.

19. The photosensitive resin composition according to claim 13, wherein the quantum dots are red quantum dots, yellow quantum dots, orange quantum dots, green quantum dots, blue quantum dots or a combination thereof.

* * * * *